Figure 1:
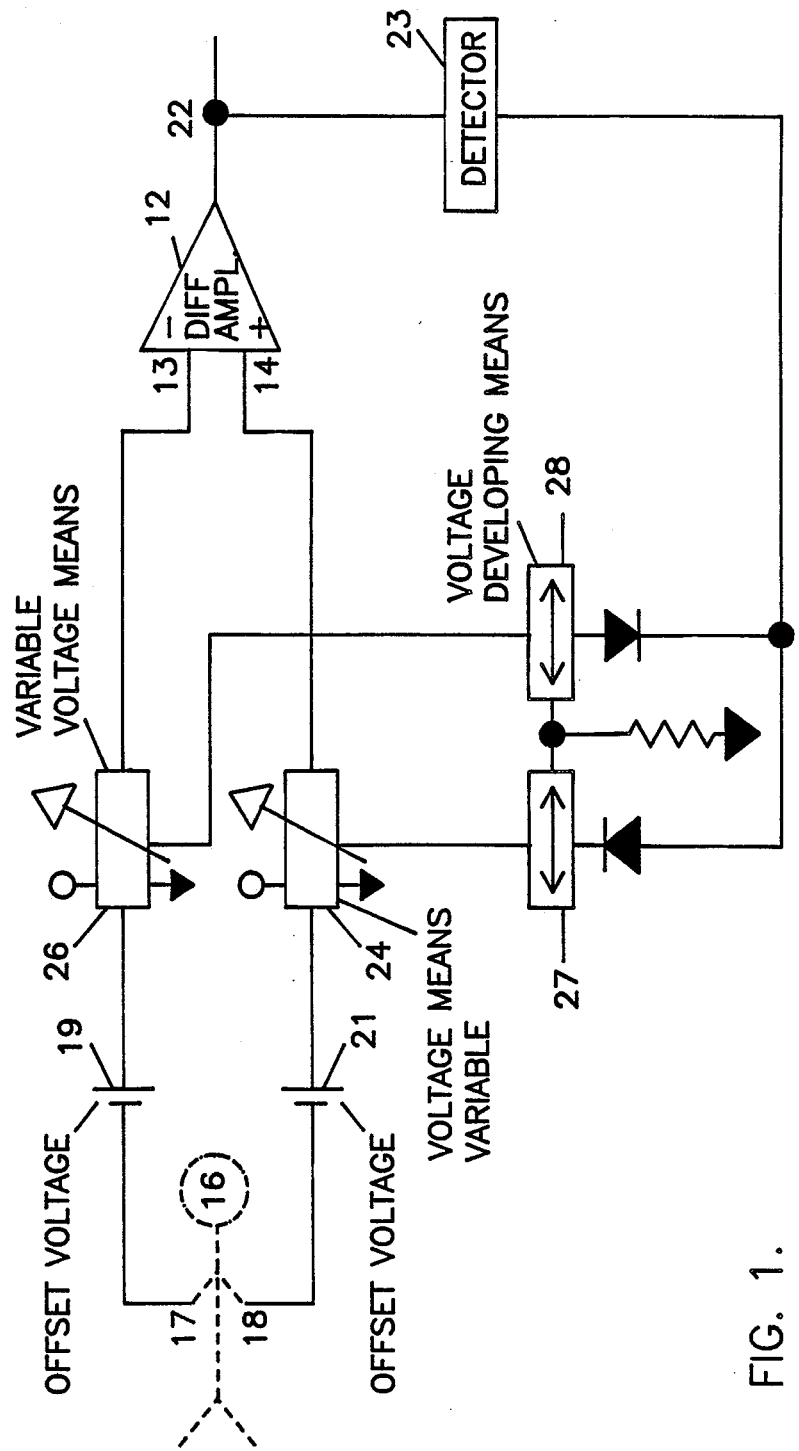

United States Patent [19]

Kamil

[11] Patent Number: 4,896,120
[45] Date of Patent: Jan. 23, 1990

[54] INSTRUMENTATION AMPLIFIER ARRANGEMENT

[76] Inventor: Zvi Kamil, 14 David Hamelech St., Tel Avia, Israel

[21] Appl. No.: 29,538

[22] Filed: Mar. 24, 1987

[30] Foreign Application Priority Data

Mar. 24, 1986 [IL] Israel .................................. 78244

[51] Int. Cl.[4] .......................................... H03F 17/00
[52] U.S. Cl. ...................................... 330/59; 128/902; 330/258; 330/259; 330/308
[58] Field of Search .................. 330/59, 256, 258, 259, 330/308; 128/902

[56] References Cited

U.S. PATENT DOCUMENTS 4,088,962  5/1978  Trilling .............................. 330/59 X
4,301,421  11/1981  Yokoyama ...................... 330/259 X Primary Examiner—James B. Mullins
Attorney, Agent, or Firm—Sandler & Greenblum

[57] ABSTRACT

A substantially zero average DC output voltage is obtained in an instrumentation amplifier without degrading the gain by detecting the output of the amplifier and operating a non-galvanically coupled device responsive to the detected output to apply feedback to the amplifier for balancing out common mode output voltages.

5 Claims, 2 Drawing Sheets

INSTRUMENTATION AMPLIFIER ARRANGEMENT

FIELD OF THE INVENTION

This invention is concerned with instrumentation amplifiers and more particularly with differential amplifier arrangements used in instrumentation circuits.

BACKGROUND OF THE INVENTION

Amplifiers used in instrumentation circuits often require output signals responsive to differential inputs; that is the difference between inputs supplied to positive and negative input terminals of the amplifier.

Amplifiers have been designed for such purposes which provide the desired characteristics; i.e. high input impedance, high gain, excellent signal to noise ratios and high common mode rejection ratios. However, when D.C. offsets are used in the inputs of such instrumentation amplifiers, the desired characteristics are degraded drastically. Examples of differential amplifiers used with such D.C. offsets are those used in conjunction with electrocardiograph (ECG) systems.

The D.C. offsets make it extremely difficult to maintain high common mode rejection ratios. As is well known when the same input signal is applied to each of the input terminals of a differential amplifier then there should be no output voltage. In practical terms a common mode output voltage is obtained. The common mode rejection ratio is a measure of how well a differential amplifier rejects equal signals which appear simultaneously and in phase at both input terminals (the common mode signal). Thus, the common mode rejection ratio is the ratio of the common mode input voltage to the output rejection. The extent to which a differential amplifier does not provide an output voltage when the same signal is applied to both inputs is measured by the common mode rejection ratio.

It is highly desirable to have high common mode rejection ratios in instrument amplifiers such as those used in ECG systems. Nonetheless it remains a problem to those skilled in the art to provide differential amplifiers with DC offsets that do have high common mode rejection ratios.

BRIEF DESCRIPTION OF THE INVENTION

Accordingly, it is an object of the present invention to provide circuit arrangements wherein differential amplifiers even these with D.C. offsets in the inputs, have practically zero average DC output, high gain high input impedances and high signal to noise ratios. A high common mode rejection ratio would provide nearly zero average DC voltage at the output of the differential amplifier. Thus maintaining zero average DC output voltage from the amplifier would be similar to improving the common mode rejection ratio if it could be done without adversely affecting the high input impedance or high gain of the amplifier.

According to a broad aspect of the invention instrumentation amplifier arrangement are provided comprising:

operational amplifier means having an inverting input and a non-inverting input, means for measuring the DC signal at the output of the operational amplifier means, first voltage developing means including first variable voltage source means for applying a first feedback controlled signal to said inverting input, second voltage developing means including a second variable voltage source means for applying a second feedback controlled signal to said non-inverting input, and means responsive to said measured DC signal for controlling the first and second voltage developing source means to provide DC compensation to cancel the average DC output voltage by controlling the DC input voltage.

A feature of the invention comprises circuit means for averaging the DC signal at the output of the operational amplifier and using said average DC signal to modifiy the variable voltage sources at the inputs of the operational amplifier to compensate for the common mode average DC output voltage by controlling the DC input voltage.

Another feature of the invention includes means for optically coupling the D.C. output voltage detecting means to the variable voltage source means. More particularly in a preferred embodiment the optical coupling means comprises photodiodes in said inputs to the inverting and non-inverting terminals. The measured DC signals are used to vary the output of light emitting diodes (LEDs) positioned closed to said photo diodes to thereby vary the voltages developed across the photo diodes as a function of the DC output signals.

Still another feature of the invention includes the use of opto-couplers connected in a "push-pull" arrangement at the inverting and non-inverting inputs of the differential amplifier to compensate for the average DC output voltage without adversely effecting the gain or the input impedance or seriously effecting the signal to noise ratio.

Figure 2:
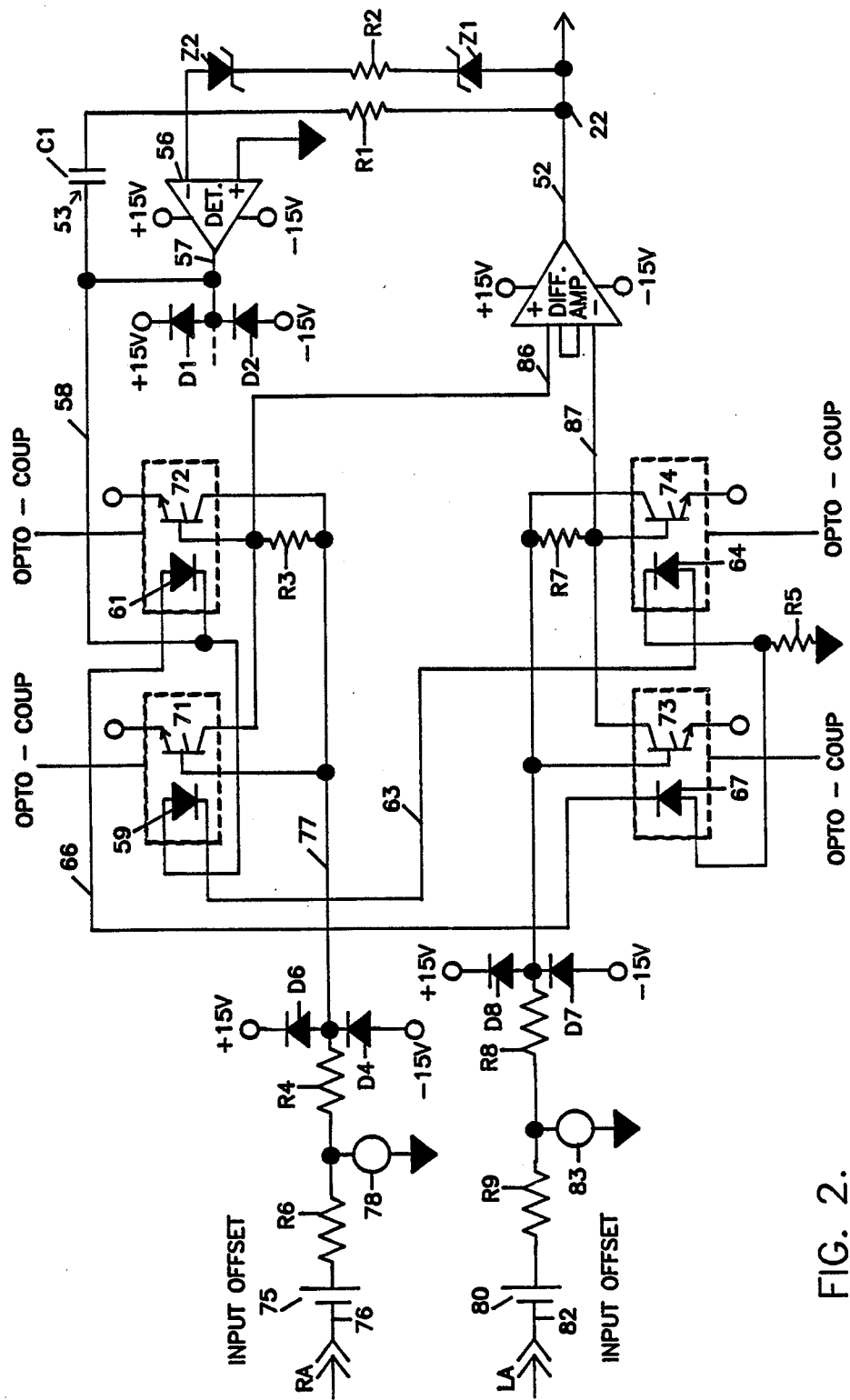

The above named and other objects and features of the present invention may be best understood when considered in the light of the following description of a broad aspect of the present invention made in conjunction with the accompanying drawings; wherein:

FIG. 1 is a block diagram arrangement of the inventive differential amplifier, and FIG. 2 is a schematic showing of a preferred embodiment of the present invention.

GENERAL DESCRIPTION

FIG. 1 shows an instrument amplifier arrangement 11 according to the invention. Therein, the arrangement includes an operational amplifier 12 having a negative input 13 and a positive input 14. The inputs, by way of example, are coupled to a patient 16 for obtaining electrocardiograph readings. A lead 17 is coupled to a sensor on the patient's left arm and a lead 18 is coupled to a sensor on the patient's right arm. Offset voltages are shown at 19 and 21 for leads 17 and 18, respectively.

Detection means 23 are provided for detecting the DC output voltage of the operational amplifier 12. The detection means is connected to the output of operational amplifier 12 at 22. The detection means detects the D.C. voltage output of amplifier 12 and in a preferred embodiment the detection means 23 averages or integrates the D.C. output voltage.

Variable voltage supply means are provided at the inputs of the amplifier. The variable voltage means are controlled by the DC voltage output of the operational amplifier 12. If the D.C. voltage output is positive then the variable voltage means of block 24 provides less voltage to decrease the voltage at the positive input of the operational amplifier 12. At the same time, the voltage at the negative input to the operational amplifier is increased by causing the voltage supply means 26 to increase its output. Thus the positive voltage at the output is decreased and the negative voltage is increased.

Continuous feed-back coupling means are provided. The coupling means between the DC output voltage detector 23 and the voltage developing means 24 and 26 are the devices 27 and 28 respectively. These devices indicate that they are operated responsive to the positive or negative voltages, respectively for moving the controls on variable voltage means 24 and 26 to increase or decrease the voltage at the inputs of the operational amplifier to assure that the DC voltage at 22 is zero. In the absence of the positive or negative voltage at the output there is no change in the input. As soon as there is a positive or a negative voltage at the output, then the voltage means 24 and 26 are varied to increase or decrease the voltages at the inputs to amplifier 12.

A problem with the average DC feedback control arrangements used in the past has been in the feedback coupling of the output to the input. The feedback must provide an almost instantaneous reaction and nonetheless there must be no wire or current coupling ("non-galvanic") between the differential input and the amplifier output. Thus, for example, mechanical movement to vary the inputs as a result of the output are too slow. Feedback resistances and actual current carrying means in the feedback loop between the output and the inputs cause many unwanted problems such as noise generation and a reduction of the gain.

In a preferred embodiment the means for controlling the voltage inputs to the operational amplifier 12 couples the output of the amplifier to the inputs of the amplifier with opto- coupling devices.

FIG. 2 is a schematic showing of an arrangement for maintaining the average DC output voltage output of differential amplifiers of the instrument amplifier at zero potential. More particularly FIG. 2 shows a differential amplifier in the form of a operational amplifier 12. The output of the amplifier is shown as carried by conductor 52.

Means are provided for measuring the DC output of the amplifier. More particularly an integrator circuit 53 is connected to the output of the amplifier at point 22 which connects conductor 52 to circuit 53. The integrating circuit 53 comprises a resistor capacitor network that includes resistor R1 in series with capacitor C1. The junction of the resistor R1 and capacitor C1 is connected to the negative input of operational amplifier 56. The output 57 of the amplifier 56 is connected to the other side of the capacitor C1 to complete the integrator circuit.

As shown in FIG. 2 overload protection may be provided at the integrator circuit. More particularly a zener diode Z1 is shown serially connected through resistor R2 to zener diode Z2. This serial connection is connected to the junction point of resistor R1 and capacitor C1 at the negative input of operational amplifier 56. The positive input of operational amplifier 56 is connected to instrument ground.

The output of the operational amplifier 56 is connected through oppositely going diodes D1 and D2 to positive and negative voltages, respectively for protection. It should be understood while an integrator circuit is shown, any type of averaging can be used in place of the integrator circuit. For example a sample and hold unit, analog or digital, may also be used.

The output of the integrator circuit is coupled to a pair of voltage source means which are in turn coupled through to the two inputs of the differential amplifier 12 through voltage developing means. There is direct coupling between the output of the integrator and light generating means such as a plurality of LEDs. A pair of LEDs are shown photo-optically coupled to each input of the differential amplifier 12. The purpose of the LEDs is to photocouple the output of the integrator circuit to the voltage developing means at the inputs of the differential amplifier 12. The voltage developing means actively negate the output of the operational amplifier to maintain the DC output of the operational amplifier 12 at zero. This is particularly important when offsetting voltages are used in the instrumentation amplifiers. Among other things, maintaining the output of the instrumentation amplifier at zero DC voltage minimizes the constant problem of base line wander, otherwise encountered.

The output of integrator amplifier 56 on conductor 57 is coupled through conductor 58 to a positive going LED 59 and a negative going LED 61. Thus, when the average DC output of amplifier 12 is positive, current is directed through the LED 59 over conductor 63, LED 64, and through current return limiting resistor R5 to the instrument ground. When the average voltage at the output of the instrument amplifier 51 is negative as determined by the integrator amplifier 56 then the current is directed through LED 61, conductor 66, LED 67 and resistor R5 to instrument ground.

The LEDs are optically coupled to light responsive voltage means such as photodiodes. More particularly LED 59 is coupled to a phototransistor 71 connected as a photodiode. LED 61 is optically coupled to photodiode 72. LED 67 is optically coupled to photodoide 73 and LED 64 is similarly coupled to photodiode 74.

The optical coupling assures that there is no degradation of the gain of the amplifier and nonetheless the feedback circuit is coupled in an efficient manner to the input of the differential amplifier to maintain the output at zero DC voltage.

A current flowing through LED 59 causes light to be emitted. The light intensity is a function of the integrator output. The light emitted strikes photodiode 71 and causes the photodiode to develop a signal. The photodiodes 71 and 72 are each connected across a voltage developing resistor R3. The resistor R3 is connected to the negative input of differential amplifier 12. The other side of the resistor R3 is connected through conductor 77 and resistors R4 and R6 to the lead 76. An offsetting voltage 75 is shown connected to the conductor 77. Opposite going diodes D4 and D6 connected respectively to negative and positive voltage provide overvoltage protection.

Means may be provided in the case of an ECG instrumentation amplifier for protecting against sudden voltage surges. More particularly voltage limiting device 78 is shown connected between resistors R4 and R6 and instrument ground to provide a path for any voltage surges.

The photodiodes 73 and 74 are also connected across a voltage developing resistor R7. The resistor R7 has one side connected to the positive input of the differential amplifier 51 and the other side connected through conductor 82, and series dropping resistors R8 and R9 to the input lead 82 of the instrumentation amplifier arrangement. Here again offsetting voltages 80 are shown, connected to conductor 82. Opposite going diodes shown as diodes D7 and D8 connected to negative and positive voltages respectively. A voltage limiting device 83 is provided and is shown connected between instrument ground and the junction of the resistors R9 and R8. The diode and the voltage limiting device may be provided for protection against voltage surges, for example.

In operation, the circuit measures DC voltages appearing on conductor 53 at the output of differential amplifier 12. The voltage is preferably averages by integrating circuit 53. If the average is positive then the current flows through LED 59 and LED 64 and resistor R5 to instrument ground. The light emitted by the diodes 59 and 64 cause photodiodes 71 and 74 to develop voltages across resistors R3 and R7 in a direction to counteract the non-zero average DC output voltage voltages and to thereby assure zero D.C. voltage on conductor 52. Thus, the positive D.C. voltage on conductor 52 will cause a negative voltage to appear at the negative input 86 of amplifier 12 and a negative voltage to appear at the positive input 87 of amplifier 12. Similarly a negative voltage on conductor 52 would cause current to flow through LED 61 and LED 67 through dropping resistor R5 to instrument ground. Current flowing through diodes 61 and 67 photocouple the LEDs to photodiodes 72 and 73. The light striking photodiodes 72 and 73 causes voltages to develop across resistors R3 and R7 in a direction to counteract the negative voltage. Thus, a positive voltage is developed at input 86 and a negative voltage is developed at input 87, to speedily wipeout or change the output voltage from negative to zero.

It should be understood that while dual optocouplers are shown, a single optocoupler at one output or at each input could be used to generate the voltages for cancelling input voltages designed to maintain the D.C. output voltage at zero. It should also be noted that series groups of optocouplers could be used to increase the voltages developed across resistor R3 and R7.

In a preferred embodiment the following circuit component values are used:

R1 - 10m ohms
R2 - 1K ohms
R5 - 1.8K ohms (current return limiting)
R3,R7 - 20K - 1%ohms
R4,R6,R8,R9 - 5.1K - 1%
C1 - 4,7 uf
D1-D4 . . . IN 914B
Z1,Z2 . . . IN 4742
Optocouplers - 4N27 (Texas Instruments)
Amplifier 12 - UE AD524 (Analog devices)
Amplifier 56 - UE CA 3140 (RCA)
Supply Voltages ±15 v While the invention has been described in relation to a preferred embodiment it should be understood that the preferred embodiment is by way of example only and not as a limitation on the scope of the invention.

I claim:

1. A high gain instrumentation amplifier arrangement having input DC offsets for use in conjunction with electrocardiograph (ECG) systems said arrangements comprising:
   (a) voltage mode differential operational amplifier means having a positive input port and a negative input port;
   (b) means including a first sensor of said ECG system and a first input offset voltage for supplying voltage to said positive input means port and also including a second sensor of said ECG system and a second input offset voltage for supplying voltage to said negative input port;
   (c) a feedback arrangement to cancel non-zero average DC output voltages from said differential amplifier means, said feedback arrangement comprising:
      (1) integrator circuit means for detecting and integrating said non-zero average DC voltage from said differential amplifier means to provide control signals;
      (2) LED means coupled to the output of said integrator circuit means, photo diode operated voltage developing means coupled to said positive and negative input ports of said differential amplifier means;
      (3) said LED means optically coupled to said photo diode means and comprising a first and a second positive going LED;
      (4) said photo diode means comprising first and second photo diode;
      (5) said LED means further comprising first and second negative going LED means;
      (6) said photo diode means further comprising third and fourth photo diodes;
      (7) said first and second photo diodes being optically coupled to said first and second positive going LED's respectively;
      (8) said third and fourth photo diodes optically coupled to said first and second negative going LED's respectively;
      (9) first voltage developing resistor means coupled across said first and third photo diodes to develop opposing voltages thereacross;
      (10) second voltage developing resistor means coupled across said second and fourth photo diodes to develop opposing voltages there across; and
      (11) said first and second voltage developing resistors being connected to said positive and negative input ports of said differential amplifier, respectively, to cancel said non-zero average DC output voltage from said differential amplifier.

2. A high input impedance, high gain instrumentation amplifier arrangement for use with electrocardiagraph (EOG) systems, said arrangement comprising:
   (a) a differential amplifier having a positive input port and a negative input port,
   (b) first means including a first sensor means and first offset voltage means for supplying voltage to said positive input port,
   (c) second means including a second sensor means and a second offset voltage means for supplying voltage to said negative input port,
   (d) a feedback arrangement operated responsive to average DC output voltages at the output of said differential amplifier for supplying input voltages to the input ports of said differential amplifier to cancel non-zero average DC output voltages, said feedback arrangement comprising:
      (1) detecting means for detecting and averaging DC output voltages,
      (2) voltage developing means coupled to said input ports and operated responsive to the average DC output voltages for developing input voltages to cancel said non-zero average DC output voltages, and (3) non-galvanic coupling means for coupling said average DC output voltages from said detecting means to said voltage developing means without adversely affecting the high gain of the instrumentation amplifier arrangement.

3. The amplifier arrangement of claim 2 wherein said voltage developing means comprises:

first photodiode means for developing positive voltages responsive to a negative average DC output voltages, said developed positive voltages coupled to said positive input port to increase the positive voltage input for cancelling said negative average DC output voltage, second photodiode means for developing negative voltages responsive to a positive average DC output voltages, said developed negative voltages coupled to said negative input port for cancelling said positive average DC output volage, wherein said non galvanic coupling means comprises:

first LED means optically coupled to provide light rays onto said first photodiode means responsive to said negative average DC output voltage, and second LED means optically coupled to provide light rays to said second photodiode means responsive to said positive average DC output voltage.

4. The amplifier arrangement of claim 3 wherein said voltage developing means comprises:

third photodiode means for developing negative voltages responsive to said positive average DC output voltage, said developed negative voltage coupled to said positive input port for cancelling said positive average DC output voltage, fourth photodiode means for developing positive voltages responsive to said negative average DC output voltages, said developed positive voltages coupled to said negative input port for cancelling said negative average DC output voltages, said non-galvanic coupling neans further comprising third LED means optically coupled to provide light rays to said third photodiode means responsive to said positive average DC voltage output, and fourth LED means optically coupled to provide light rays to said fourth photodiode means responsive to said negative average DC output voltage.

5. The instrumentation amplifier arrangement of claim 4 wherein said differential amplifier is an operational amplifier.

* * * * *